(12) United States Patent
Xie et al.

(10) Patent No.: US 10,837,803 B2
(45) Date of Patent: Nov. 17, 2020

(54) INSPECTION SYSTEM WITH GROUNDED CAPACITIVE SAMPLE PROXIMITY SENSOR

(71) Applicant: KLA-Tencor Corporation, Milpitas, CA (US)

(72) Inventors: Yang Xie, San Jose, CA (US); Feilong Lin, Fremont, CA (US); Rushford A. Ogden, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/401,324

(22) Filed: May 2, 2019

(65) Prior Publication Data

US 2020/0326211 A1     Oct. 15, 2020

Related U.S. Application Data

(60) Provisional application No. 62/833,043, filed on Apr. 12, 2019.

(51) Int. Cl.
*G01R 27/26* (2006.01)
*G01D 5/241* (2006.01)
(Continued)

(52) U.S. Cl.
CPC .......... *G01D 5/2417* (2013.01); *G01B 7/003* (2013.01); *G01B 7/02* (2013.01); *G01B 7/023* (2013.01); *G01B 7/14* (2013.01); *H03K 17/955* (2013.01); *H03K 17/962* (2013.01); *H03K 2017/9602* (2013.01); *H03K 2217/960755* (2013.01)

(58) Field of Classification Search
CPC .......... G01B 7/14; G01B 7/023; G01B 7/003; G01B 7/02; H03K 17/955; H03K 17/962; H03K 2217/960755; H03K 2017/9602

USPC .......... 324/76.11–76.83, 459, 600, 635, 644, 324/649, 658, 661, 662, 671, 716
See application file for complete search history.

(56) References Cited

U.S. PATENT DOCUMENTS 9,910,065 B2    3/2018   Budach et al.
2011/0254565 A1  10/2011  DeBoer et al.
(Continued)

FOREIGN PATENT DOCUMENTS

KR    20140041616 A    4/2014

OTHER PUBLICATIONS

International Search Report and Written Opinion dated Jul. 20, 2020 for PCT/US2020/027565.

*Primary Examiner* — Raul J Rios Russo
(74) *Attorney, Agent, or Firm* — Suiter Swantz pc llo

(57) ABSTRACT

A capacitive proximity measurement system may include a sensor electrode configured to be positioned proximate to a conductive measurement area on a test surface of a sample, a plate connector configured to provide an electrical connection between a system ground and a conductive plate parallel to the test surface, and a controller. A measurement circuit may be formed between the sensor electrode and the conductive plate, where the test surface is electrically floating with respect to the sensor electrode and the conductive plate. The controller may further adjust a voltage of the sensor electrode with respect to the conductive plate, determine a capacitance associated with the measurement circuit, and determine a distance between the electrode and the measurement area based on the capacitance associated with the measurement circuit.

32 Claims, 11 Drawing Sheets

(51) Int. Cl.
  *G01B 7/14*  (2006.01)
  *G01B 7/02*  (2006.01)
  *G01B 7/00*  (2006.01)
  *H03K 17/955*  (2006.01)
  *H03K 17/96*  (2006.01)

(56) References Cited

U.S. PATENT DOCUMENTS

| | | |
|---|---|---|
| 2014/0218056 A1 | 8/2014 | Alatas et al. |
| 2015/0162932 A1* | 6/2015 | Page ............... G06F 3/0418 324/658 |
| 2018/0217190 A1* | 8/2018 | Spevak ............. G01N 27/228 |
| 2018/0330935 A1 | 11/2018 | Reed et al. |
| 2019/0242689 A1* | 8/2019 | Elhajj ............... G01B 7/085 |

* cited by examiner

INSPECTION SYSTEM WITH GROUNDED CAPACITIVE SAMPLE PROXIMITY SENSOR

CROSS-REFERENCE TO RELATED APPLICATION

The present application claims the benefit under 35 U.S.C. § 119(e) of U.S. Provisional Application Ser. No. 62/833,043, filed Apr. 12, 2019, entitled EUV RETICLE BACKSIDE GROUNDING FOR RETICLE HEIGHT MEASUREMENT IN EUV RETICLE EBEAM INSPECTION SYSTEM, naming Yang Xie, Feilong Lin, and Rushford A. Ogden as inventors, which is incorporated herein by reference in the entirety.

TECHNICAL FIELD

The present disclosure relates generally to sample proximity detection in inspection systems and, more particularly, to proximity detection of samples having spatially-varying resistance in inspection systems.

BACKGROUND

Inspection systems are typically designed to inspect a sample located at a specific working distance from one or more components of the system (e.g., sample height). The sample may be thus properly aligned in the system when at the proper working distance. Further, misalignment of the sample height may negatively impact system performance in various ways such as, but not limited to, misaligning detectors or increasing the spot size of a source beam on the sample and thus the system resolution.

Inspection systems typically include one or more proximity sensors to detect and control the sample position within the system. Further, inspection systems typically use capacitive proximity sensors with samples having an electrically-conductive top layer such as, but not limited to, reticles used in lithography. In this regard, the electrically-conductive top layer is connected to a detection circuit and a measured capacitance between the electrode and the electrically-conductive top layer is directly related to the distance between the electrode and the sample. However, many samples of interest such as, but not limited to, reticles suitable for EUV lithography have spatially-varying resistance. As a result, measurement of such samples with a typical capacitance proximity sensor may result in proximity errors that vary depending on the spatial position of the electrode. Therefore, it is desirable to provide systems and methods for proximity detection of samples having spatially-varying resistance.

SUMMARY

A capacitive proximity measurement system is disclosed in accordance with one or more illustrative embodiments of the present disclosure. In one illustrative embodiment, the system includes a sensor electrode that may be positioned proximate to a conductive measurement area on a test surface of a sample. In another illustrative embodiment, the system includes a plate connector that may provide an electrical connection between a system ground and a conductive plate parallel to the test surface, where a measurement circuit is formed between the sensor electrode and the conductive plate and where the test surface is electrically floating with respect to the sensor electrode and the conductive plate. In another illustrative embodiment, the system includes a controller communicatively coupled to the sensor electrode and the plate connector. In another illustrative embodiment, the controller adjusts a voltage of the sensor electrode with respect to the conductive plate. In another illustrative embodiment, the controller determines a capacitance associated with the measurement circuit. In another illustrative embodiment, the controller determines a distance between the electrode and the measurement area based on the capacitance associated with the measurement circuit.

An inspection system is disclosed in accordance with one or more illustrative embodiments of the present disclosure. In one illustrative embodiment, the system includes an electron beam column for directing an electron beam to a sample. In another illustrative embodiment, the system includes a capacitive proximity measurement system located adjacent to the electron beam column. In another illustrative embodiment, the capacitive proximity measurement system includes a sensor electrode that may be positioned proximate to a conductive measurement area on a test surface of a sample. In another illustrative embodiment, the capacitive proximity measurement system includes a plate connector configured that may provide an electrical connection between a system ground and a conductive plate parallel to the test surface, where a measurement circuit is formed between the sensor electrode and the conductive plate and where the test surface is electrically floating with respect to the sensor electrode and the conductive plate. In another illustrative embodiment, the capacitive proximity measurement system may include a controller communicatively coupled to the sensor electrode and the plate connector. In another illustrative embodiment, the controller adjusts a voltage of the sensor electrode with respect to the conductive plate. In another illustrative embodiment, the controller determines a capacitance associated with the measurement circuit. In another illustrative embodiment, the controller determines a distance between the electrode and the measurement area based on the capacitance associated with the measurement circuit.

A method for capacitive proximity measurements is disclosed in accordance with one or more illustrative embodiments of the present disclosure. In one illustrative embodiment, the method includes receiving a sample having a conductive measurement area on a test surface. In another illustrative embodiment, the method includes placing a sensor electrode proximate to the measurement area. In another illustrative embodiment, the method includes placing a conductive plate parallel to the test surface. In another illustrative embodiment, the method includes forming a measurement circuit between the sensor electrode and the conductive plate, where the test surface is electrically floating with respect to the sensor electrode and the conductive plate. In another illustrative embodiment, the method includes adjusting a voltage of the sensor electrode with respect to the conductive plate. In another illustrative embodiment, the method includes measuring a capacitance associated with the measurement circuit. In another illustrative embodiment, the method includes determining a distance between the electrode and the measurement area based on the capacitance associated with the measurement circuit.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1:
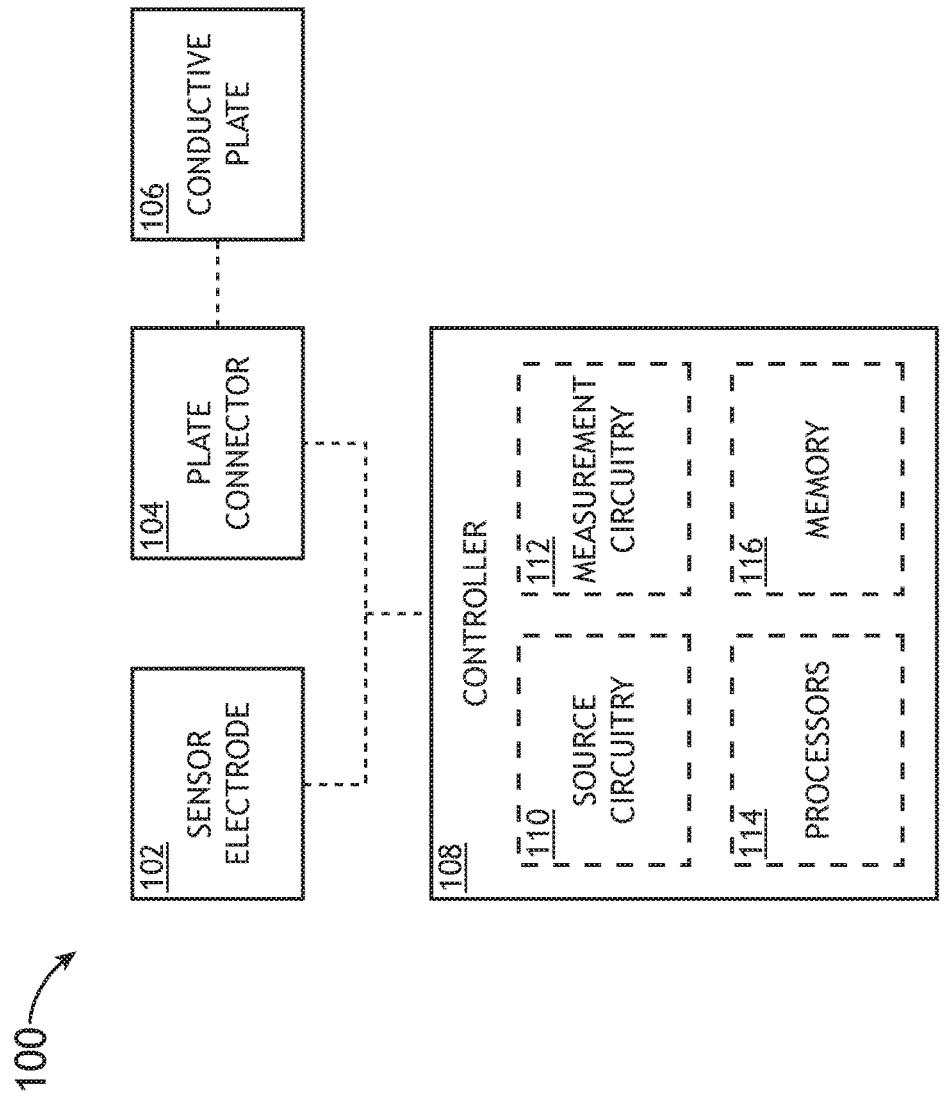
FIG. 1 is a block diagram illustrating a capacitive proximity measurement system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a capacitive proximity measurement system where a proximity measurement is based on a capacitance between an electrode and a test surface as well as a capacitance between the test surface and a conductive plate oriented parallel to the test surface. In this regard, the capacitive proximity measurement system may be suitable for determining a position of a test surface having a spatially-varying resistance.

It is recognized herein that capacitive proximity detection may typically be carried out by connecting a conductive test surface to a controller circuit including an electrode (e.g., a plate electrode), measuring a capacitance between the electrode and the test surface, and determining a distance between the electrode and the test surface based on the measured capacitance. Further, the test surface may typically be connected to the controller circuit through a lead in mechanical and electrical contact with the test surface. However, if the test surface has a spatially-varying resistance, the measured capacitance may vary based on the relative positions of the contact point of the lead on the test surface and the spatial position of the electrode along the test surface. As a result, the system may be prone to measurement error based on the relative positions of the contact point of the lead on the test surface and the spatial position of the electrode along the test surface. It is further recognized herein that many samples of interest such as, but not limited to, reticles for extreme ultraviolet (EUV) lithography may exhibit spatially-varying resistance such that proximity measurements may suffer from this measurement error.

Embodiments of the present disclosure provide a distance measurement between an electrode and a test surface based on at least two capacitance values: a capacitance between the electrode and the test surface and a capacitance between the test surface and an additional conductive plate parallel to the test surface. Further, a controller including source and measurement circuitry may be connected to the electrode and the conductive plate to complete a measurement circuit. In this regard, the test surface is not in direct electrical contact with any leads and may thus electrically float with respect to the electrode and the conductive plate. Consequently, the impact of any spatially-varying resistance across the surface of the test surface on the distance measurement may be substantially reduced or eliminated.

The conductive plate may be separated from the test surface along any direction. In some embodiments, the conductive plate is on an opposite side of the test surface than the electrode. Further, the conductive plate may be separate from or integrated with a sample containing the test surface. As a non-limiting example, reticles used in reflective lithography such as, but not limited to, EUV lithography may include a pattern of reflective elements on an insulating substrate. Accordingly, the conductive plate may be formed as a conductive layer deposited onto a back surface of the insulating substrate. By way of another example, a capacitive proximity measurement system may include a separate conductive plate. For instance, a sample may rest on the separate conductive plate during a measurement.

In some embodiments, the conductive plate is on the same side of the test surface as the electrode. For example, the conductive plate may include an unobstructed line of sight between the electrode and the test surface. Further, a portion of the electrode or the associated housing may protrude through, but is not required to protrude through, the aperture.

In some embodiments, a capacitive proximity measurement system includes two or more conductive plates. For example, a capacitive proximity measurement system may include conductive plates on both sides of a test surface.

Additional embodiments of the present disclosure are directed to an inspection system including a capacitive proximity measurement system as disclosed herein. In this regard, the capacitive proximity measurement system may detect and/or control a position of a sample within the inspection system (e.g., a sample height in the measurement system). Accordingly, the capacitive proximity measurement system may facilitate accurate alignment of a wide range of samples in the inspection system including, but not limited to, samples including a spatially-varying resistance across a test surface.

Referring now generally to FIGS. 1 through 11, systems and methods for capacitive proximity measurements for samples with spatially-varying resistance across a test surface are described in greater detail.

FIG. 1 is a block diagram illustrating a capacitive proximity measurement system 100, in accordance with one or more embodiments of the present disclosure. In one embodiment, the capacitive proximity measurement system 100 includes a sensor electrode 102 and a plate connector 104. The plate connector 104 may then be electrically connected to a conductive plate 106. In another embodiment, the capacitive proximity measurement system 100 includes a sensor controller 108 coupled to the sensor electrode 102 and the plate connector 104. In this regard, a measurement circuit may include a capacitor formed between the sensor electrode 102 and a conductive test surface as well as a capacitor formed from the conductive test surface and the conductive plate 106. Further, electrical connections between the sensor controller 108 to the sensor electrode 102 and the plate connector 104 may complete the measurement circuit.

In one embodiment, the conductive plate 106 is a component of the capacitive proximity measurement system 100. For example, the conductive plate 106 may include a plate formed from an electrically conductive material such as, but not limited to a metal. Further, the conductive plate 106 may be provided independent of the sample being tested. In another embodiment, the conductive plate 106 is a component of the sample being tested. For example, a sample may include a test surface of interest on one side of an insulating substrate and a conductive layer on an opposite side of the insulating substrate. Accordingly, the conductive layer may operate as the conductive plate 106 and the plate connector 104 of the capacitive proximity measurement system 100 and may be electrically connected to the conductive layer during a measurement.

The sensor controller 108 may include various components to provide and/or analyze a capacitive proximity measurement. In one embodiment, the sensor controller 108 includes source circuitry 110 to induce a charge on the sensor electrode 102 and/or the conductive plate 106 for a capacitance measurement. For example, the source circuitry 110 may include, but is not limited to, a voltage source and/or a current source. Further, the source circuitry 110 may include a direct current (DC) source or an alternating current (AC) source. In this regard, a capacitive proximity measurement may be performed by providing a constant and/or an alternating voltage to the sensor electrode 102.

In another embodiment, the sensor controller 108 includes measurement circuitry 112 for measuring a capacitance between the sensor electrode 102 and the test surface. Further, the measurement circuitry 112 may determine a distance between the sensor electrode 102 and the test surface based on the measured capacitance.

In another embodiment, the sensor controller 108 includes one or more processors 114 and/or a memory medium 116 (e.g., memory). For example, the sensor controller 108 may store measurement data (e.g., capacitance values, distance values, or the like) on the memory medium 116. In this regard, the measurement data may be stored for later use and/or transmitted to an external system. By way of another example, the processors 114 may be configured to execute program instructions maintained on the memory medium 116. In this regard, the one or more processors 114 of sensor controller 108 may execute any of the various process steps described throughout the present disclosure. For instance, the processors 114 may determine a distance between the sensor electrode 102 and the test surface based on a measured capacitance. In another instance, the processors 114 may control (e.g., via control signals) the source circuitry 110 to provide a selected voltage and/or current to the measurement circuit.

The one or more processors 114 of a sensor controller 108 may include any processing element known in the art. In this sense, the one or more processors 114 may include any microprocessor-type device configured to execute algorithms and/or instructions. In one embodiment, the one or more processors 114 include one or more field-programmable gate arrays (FPGAs), or the like.

Additionally, the sensor controller 108 and any associated components (e.g., the processors 114, the memory medium 116, or the like) may include one or more controllers housed in a common housing or within multiple housings (e.g., in a distributed configuration). For example, the one or more processors 114 may include desktop computer, mainframe computer system, workstation, image computer, parallel processor, or any other computer system (e.g., networked computer) configured to execute a program configured to operate the capacitive proximity measurement system 100, as described throughout the present disclosure. It is further recognized that the term "processor" may be broadly defined to encompass any device having one or more processing elements, which execute program instructions from a non-transitory memory medium 116.

The memory medium 116 may include any storage medium known in the art suitable for storing program instructions executable by the associated one or more processors 114. For example, the memory medium 116 may include a non-transitory memory medium. By way of another example, the memory medium 116 may include, but is not limited to, a read-only memory, a random access memory, a magnetic or optical memory device (e.g., disk), a magnetic tape, a solid-state drive and the like. It is further noted that memory medium 116 may be housed in a common controller housing with the one or more processors 114. In one embodiment, the memory medium 116 may be located remotely with respect to the physical location of the one or more processors 114 and sensor controller 108. For instance, the one or more processors 114 of sensor controller 108 may access a remote memory (e.g., server), accessible through a network (e.g., internet, intranet and the like). Therefore, the above description should not be interpreted as a limitation on the present invention but merely an illustration.

Further, it is to be understood that the capacitive proximity measurement system 100 may be provided in a variety of configurations to facilitate measurements of different types of samples. In this regard, various embodiments may incorporate any combination of the components illustrated in the block diagram of FIG. 1. Further, each embodiment need not include every component illustrated in the block diagram of FIG. 1.

Figure 2:
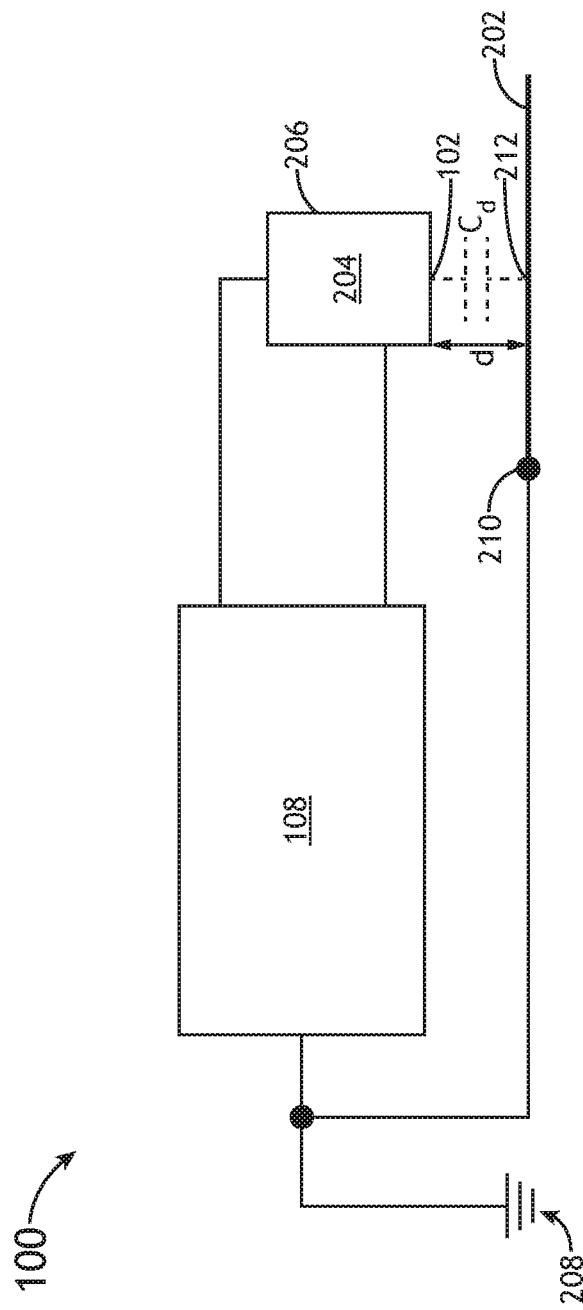
FIG. 2 is a conceptual view of a capacitive proximity measurement system configured for proximity measurements of a conductive sample, in accordance with one or more embodiments of the present disclosure.

FIG. 2 is a conceptual view of the capacitive proximity measurement system 100 configured for proximity measurements of a conductive sample 202, in accordance with one or more embodiments of the present disclosure. In one embodiment, a sensor electrode 102 is oriented parallel to (or substantially parallel to) the conductive sample 202. For example, a capacitive sensor 204 may include a sensor electrode 102 and a housing 206, which may structurally support the sensor electrode 102 and/or include additional sensing circuitry. Further, the sensor controller 108 is electrically connected to both the sensor electrode 102 and the conductive sample 202 to create a measurement circuit. For example, the conductive sample 202 may be electrically connected to a ground 208 of the measurement circuit to close the ground path of the measurement circuit. In the configuration of the capacitive proximity measurement system 100 illustrated in FIG. 2, a distance (d) between a sensor electrode 102 and the sample 202 may then be determined based on a capacitance ($C_d$) between the sensor electrode 102 and the sample 202. For example, the distance (d) between a sensor electrode 102 and the sample 202 may related to a capacitance ($C_d$) between the sensor electrode 102 and the sample 202 by Equation (1) below:

$$d = \epsilon_0 \epsilon \frac{A}{C_d}, \qquad (1)$$

where $\epsilon_0$ is the vacuum permittivity, E is the permittivity of the material between the sensor electrode 102 and the sample 202, and A is the area of the sensor electrode 102.

It is recognized herein that the measurement circuit associated with any particular measurement may broadly include any electrical paths through the measurement circuit. For example, the measurement circuit may include a sample resistance ($R_S$) related to a resistance between a lead connection point 210 on the sample 202 and a detection area 212 near the sensor electrode 102 (e.g., associated with a placement of the sensor electrode 102 along a plane of the sample 202). In this regard, it may be the case that the relative locations of the lead connection point 210 and the detection area 212 may impact the value of a measured capacitance ($C_m$) associated with the complete measurement circuit and may thus represent a source of measurement error with respect to the value of $C_d$ related to the distance (d) between the sensor electrode 102 and the sample 202.

It is further recognized that the magnitude of this measurement error may vary for different sample geometries. For example, in the case of a highly conductive sample 202, the sample resistance ($R_S$) may be sufficiently small as to be negligible. However, the measurement error may become significant in the case of a sample 202 having a sample resistance ($R_S$) that varies across a surface of the sample 202.

Figure 3:
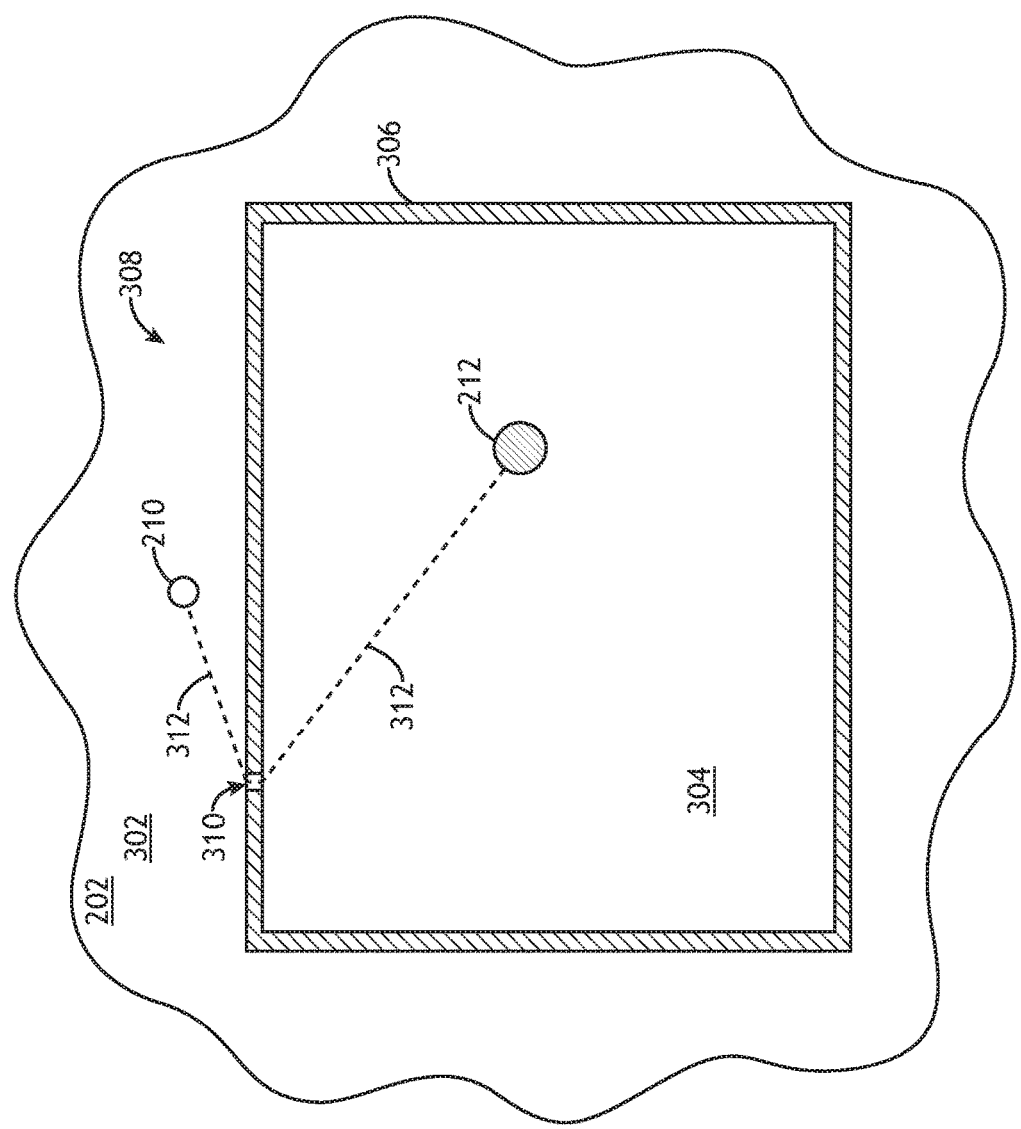
FIG. 3 is a top view of a test surface of a sample having a spatially-varying resistance ($R_S$), in accordance with one or more embodiments of the present disclosure.

FIG. 3 is a top view of a test surface 302 of the sample 202 (e.g., a top surface) having a spatially-varying resistance ($R_S$), in accordance with one or more embodiments of the present disclosure. For example, the test surface 302 depicted in FIG. 3 may correspond to a surface of a reflective reticle such as, but not limited to, a reticle suitable for EUV lithography.

In one embodiment, the test surface 302 includes a measurement area 304 corresponding to a portion of the sample 202 of interest for proximity detection. For example, the detection area 212 corresponding to the position of the sensor electrode 102 may lie within the measurement area 304 of the test surface 302.

In another embodiment, the test surface 302 includes an insulating border 306 (e.g., a black border) at least partially surrounding the measurement area 304. For example, the insulating border 306 may at least partially isolate the measurement area 304 from at least one conductive outer area 308 (e.g., an additional conductive portion of the test surface 302 outside of the insulating border 306). For instance, the insulating border 306 may provide isolation between various dies on the sample 202. In another embodiment, the test surface 302 includes one or more conductive bridges 310 (e.g., one or more black border bridges) spanning the insulating border 306. Accordingly, it may be the case that a resistance ($R_S$) between a lead connection point 210 and the detection area 212 may vary based on the relative positions of the lead connection point 210 and the detection area 212.

For example, the dashed line 312 in FIG. 3 may conceptually represent a relatively low-resistance path between the lead connection point 210 and the detection area 212 through a conductive bridge 310. Accordingly, variations of the relative positions of the lead connection point 210 and the detection area 212 (e.g., due to variations of the placement of the sample 202 with respect to the sensor electrode 102 for a particular measurement) may result in different values of the resistance ($R_S$) between a lead connection point 210 and the detection area 212. In the case that the variation in the resistance ($R_S$) between a lead connection point 210 and the detection area 212 is substantial, this variation may lead to non-negligible measurement errors in the proximity measurement.

It is to be understood, however, that the sample 202 in FIG. 3 is provided solely for illustrative purposes and should not be interpreted as limiting. Rather, the systems and methods described herein may be generally applied to samples 202 having a wide variety of layouts providing a spatially-varying resistance ($R_S$).

Figure 4:
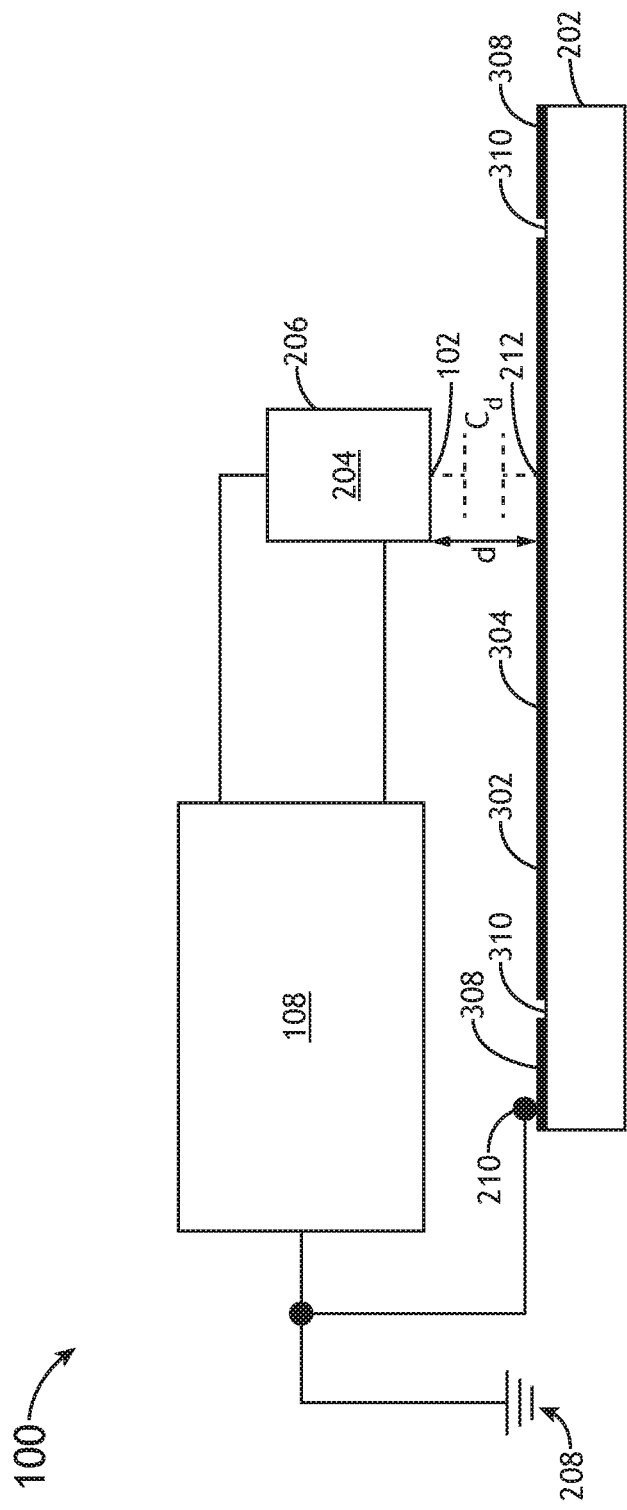
FIG. 4 is a conceptual view of a capacitive proximity measurement system configured for proximity measurements of a test surface of sample configured as shown in FIG. 3, where the test surface is electrically connected to the test surface, in accordance with one or more embodiments of the present disclosure.

FIG. 4 is a conceptual view of the capacitive proximity measurement system 100 configured for proximity measurements of the test surface 302 of sample 202 configured as shown in FIG. 3, where the test surface 302 is electrically connected to the test surface 302, in accordance with one or more embodiments of the present disclosure.

In one embodiment, an electrical lead may be placed on an outer area 308 of the test surface 302. In this regard, the measurement circuit may include the capacitance ($C_d$) between the sensor electrode 102 and the measurement area 304 as well as the resistance ($R_S$) between the lead connection point 210 and the detection area 212, which may vary based on the relative positions of the lead connection point 210 and the detection area 212 as described previously herein.

Referring now to FIGS. 5 through 11, capacitive proximity detection based on a measurement circuit including the conductive plate 106 parallel to an electrically-floating test surface 302 of interest on the sample 202 is described in greater detail.

Figure 5:
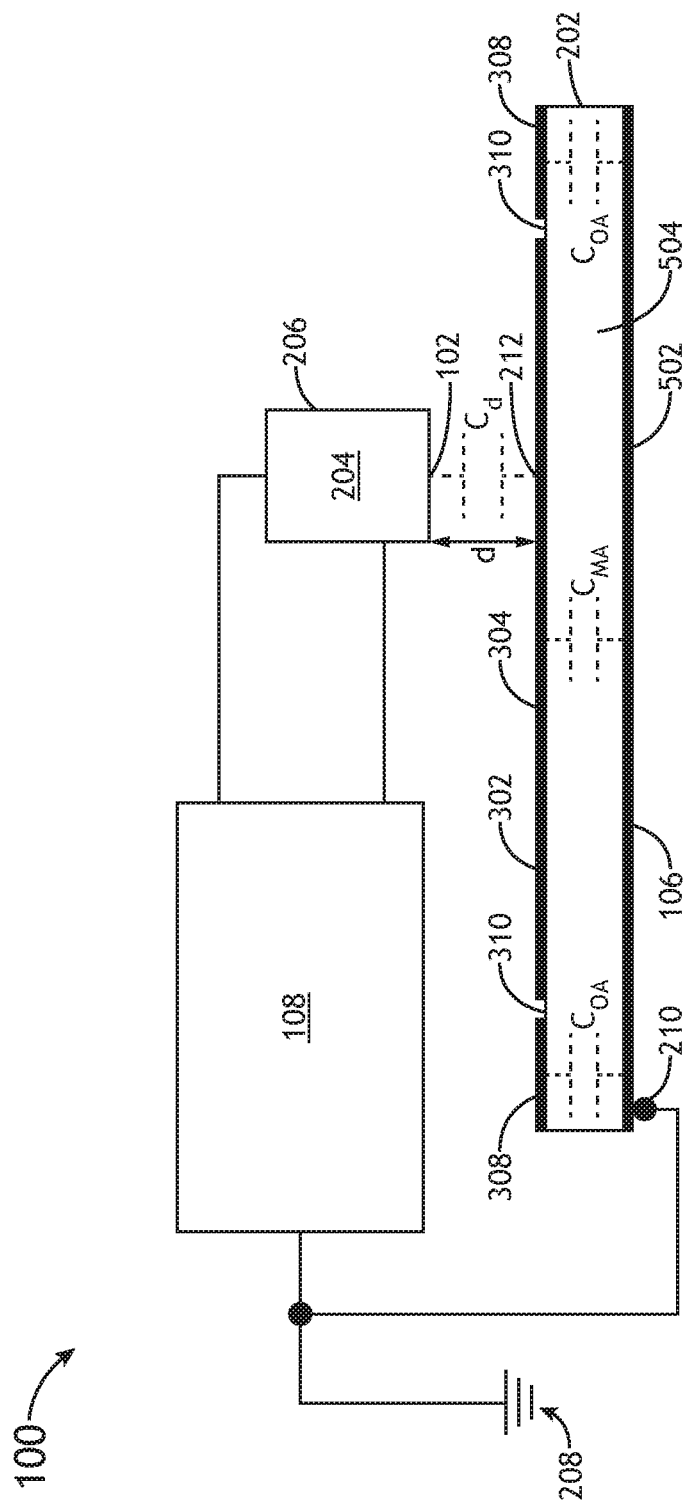
FIG. 5 is a conceptual view of a capacitive proximity measurement system for forming a measurement circuit including a conductive plate on an opposite side of an electrically-floating sample as a sensor electrode, in accordance with one or more embodiments of the present disclosure.

FIG. 5 is a conceptual view of the capacitive proximity measurement system 100 for forming a measurement circuit including the conductive plate on an opposite side of an electrically-floating sample 202 than the sensor electrode 102, in accordance with one or more embodiments of the present disclosure. Further, the test surface 302 shown in FIG. 5 corresponds to the test surface 302 shown in FIG. 3.

In one embodiment, the capacitive proximity measurement system 100 includes a plate connector 104 to connect to a conductive plate 106. The plate connector 104 may include any type of device suitable for providing an electrical connection between the conductive plate 106 and additional elements of the capacitive proximity measurement system 100. For example, the plate connector 104 may include, but is not limited to, one or more wires, or one or more electrical contacts (e.g., spring-loaded contacts, clip contacts, solder contacts, or the like).

The conductive plate 106 may be integrated into the capacitive proximity measurement system 100 or may be integrated with a sample 202 to be measured. Further, in some embodiments, capacitive proximity detection may be carried out with any number of conductive plates 106, any combination of which may be associated with the capacitive proximity measurement system 100 or a sample 202 to be measured. In one embodiment, as illustrated in FIG. 5, the conductive plate 106 may be formed as a conductive layer deposited on a back surface 502 of the sample 202. For example, a sample 202 may include, but is not required to include an insulating substrate 504 with the test surface 302 of interest on one face of the substrate 504 and a conductive layer (e.g., the conductive plate 106) on an opposite face of the substrate 504. It is recognized herein that some samples 202 may have a conductive back layer that may be suitable for use as the conductive plate 106. For instance, some EUV reticles suitable for EUV lithography include conductive back layers associated with one or more process steps independent of a proximity measurement. However, the capacitive proximity measurement system 100 may, but is not required to, utilize such a conductive back layer for a proximity measurement as described herein.

Figure 6:
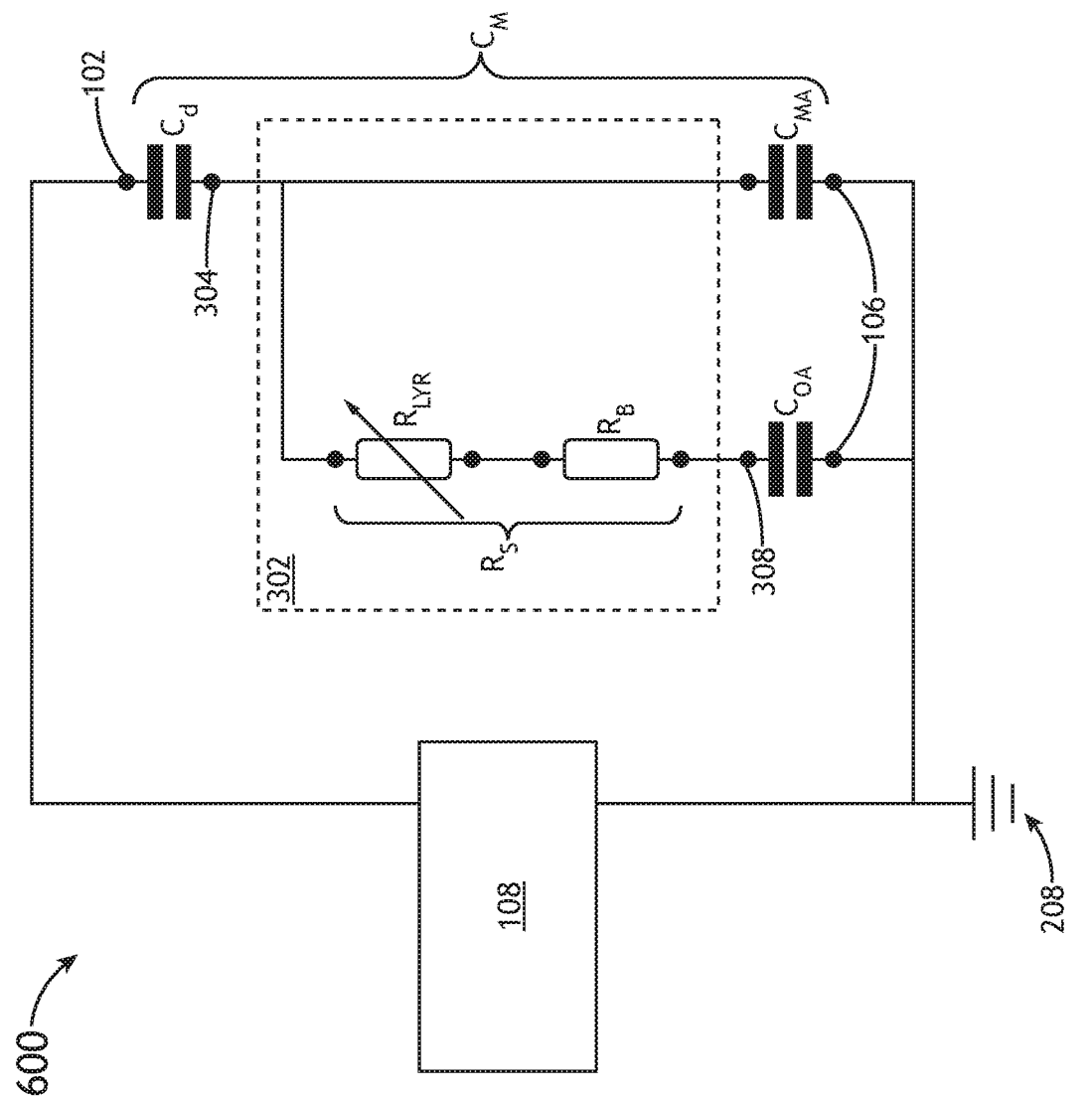
FIG. 6 is a circuit diagram associated with a measurement circuit corresponding to the capacitive proximity measurement of FIG. 5, in accordance with one or more embodiments of the present disclosure.

FIG. 6 is a circuit diagram associated with a measurement circuit 600 corresponding to the capacitive proximity measurement of FIG. 5, in accordance with one or more embodiments of the present disclosure. In one embodiment, the measurement circuit 600 includes an electrical path from the sensor controller 108 formed from the capacitance ($C_d$) between the sensor electrode 102 and the measurement area 304, a capacitance ($C_{MA}$) between the measurement area 304 and the conductive plate 106, a capacitance ($C_{OA}$) between the outer area 308 and the conductive plate 106, and a surface resistance ($R_S$). Further, the surface resistance ($R_S$) may be formed from a combination of various resistances including a resistance ($R_B$) of the insulating border 306 (e.g., including any conductive bridges 310) and a path resistance ($R_{PATH}$) of the surface and a variable layer resistance ($R_{LYR}$) that may vary based on the location of the detection area 212.

As illustrated in FIGS. 5 and 6, a total capacitance ($C_M$) measured by the measurement circuit 600 may thus include not only the capacitance ($C_d$) between the sensor electrode 102 and the measurement area 304, but also surface resistances ($R_S$) associated with the test surface 302 and additional capacitance values ($C_{MA}$ and $C_{OA}$) between the conductive plate 106 and various portions of the test surface 302. In this regard, a measurement value of the distance ($d_M$) between the sensor electrode 102 and the measurement area 304 based on the measured capacitance ($C_M$) may be characterized as:

$$d_M = \epsilon_0 \epsilon \frac{A}{C_M}, \qquad (2)$$

which corresponds to Equation (1) with the value of $C_d$ replaced with the measured capacitance ($C_M$) of the measurement circuit 600. Further, this may differ from a direct measurement of the capacitance ($C_d$) between the sensor electrode 102 and the measurement area 304 (e.g., using Equation (1) as represented). Accordingly, an error ($d_{Err}$) associated with a measurement based on the measurement circuit 600 may be characterized as $$d_{Err} = d - d_M. \qquad (3)$$

In one embodiment, the error ($d_{Err}$) may be mitigated by providing a conductive plate 106 with a large area relative to the measurement area 304. For example, the area of the conductive plate 106 may be, but is not required to be, larger than the measurement area 304. In this regard, the capacitance between the test surface 302 and the conductive plate 106 (e.g., the combination of $C_{MA}$ and $C_{OA}$) may be relatively large. Further, in the case that the capacitance between the test surface 302 and the conductive plate 106 is sufficiently large relative to the value of the capacitance ($C_d$) between the sensor electrode 102 and the measurement area 304, the error may be negligible within a selected accuracy metric. Similarly, any variations of the surface resistance ($R_S$) may also be negligible provided that the area of the conductive plate 106 is sufficiently large. In some embodiments, the area of the conductive plate 106 is selected to be at least as large as the measurement area 304 to mitigate the error ($d_{Err}$).

In another embodiment, the error ($d_{Err}$) may be compensated for by estimating and/or measuring the value of the capacitance between the test surface 302 and the conductive plate 106 (e.g., the combination of $C_{MA}$ and $C_{OA}$). Accordingly, the value of the capacitance ($C_d$) between the sensor electrode 102 and the measurement area 304 may be determined from the measured capacitance ($C_M$) such that the distance (d) between the sensor electrode 102 and the measurement area 304 may be determined from the capacitance ($C_d$).

In some embodiments, although not shown the conductive plate 106 is formed as a conductive plate (e.g., a metallic plate, or the like) suitable for supporting the sample 202 during a measurement. In this regard, the conductive plate 106 may be integrated into the capacitive proximity measurement system 100 and be independent of any samples 202.

Figure 7:
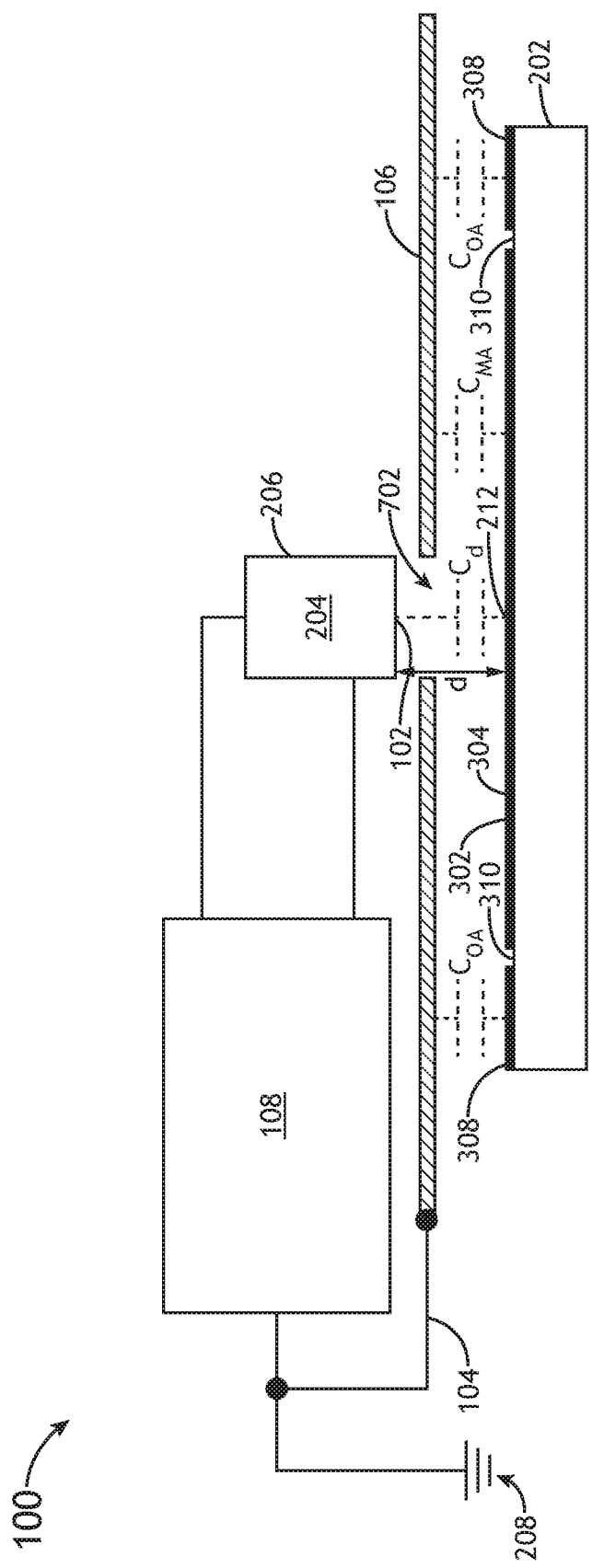
FIG. 7 is a conceptual view of a capacitive proximity measurement system for forming a measurement circuit with a conductive plate on the same side of an electrically-floating sample as a sensor electrode, in accordance with one or more embodiments of the present disclosure.

In some embodiments, the conductive plate 106 and the sensor electrode 102 are located on the same side of the test surface 302. For example, FIG. 7 is a conceptual view of the capacitive proximity measurement system 100 for forming a measurement circuit with a conductive plate 106 on the same side of an electrically-floating sample 202 as a sensor electrode 102, in accordance with one or more embodiments of the present disclosure. Further, the test surface 302 shown in FIG. 7 corresponds to the test surface 302 shown in FIG. 3.

In one embodiment, the conductive plate 106 includes an aperture 702. In this regard, a space between the sensor electrode 102 and the test surface 302 may be unobstructed such that the distance between the sensor electrode 102 and the measurement area 304 may be related to the capacitance ($C_d$) between the sensor electrode 102 and the measurement area 304 as described previously herein. In another embodiment, at least a portion of the conductive plate 106 may protrude through the aperture 702.

Further, although not shown, a corresponding measurement circuit (e.g., similar to the measurement circuit 600 illustrated in FIG. 6) associated with the capacitive proximity measurement system 100 illustrated in FIG. 7 may be generated. For example, a measurement circuit associated with the capacitive proximity measurement system 100 may have the same form as the measurement circuit 600 of FIG.

6. In some embodiments, a measurement circuit associated with the capacitive proximity measurement system 100 may include an additional term associated with a capacitance between the sensor electrode 102 and the conductive plate 106.

Figure 8:
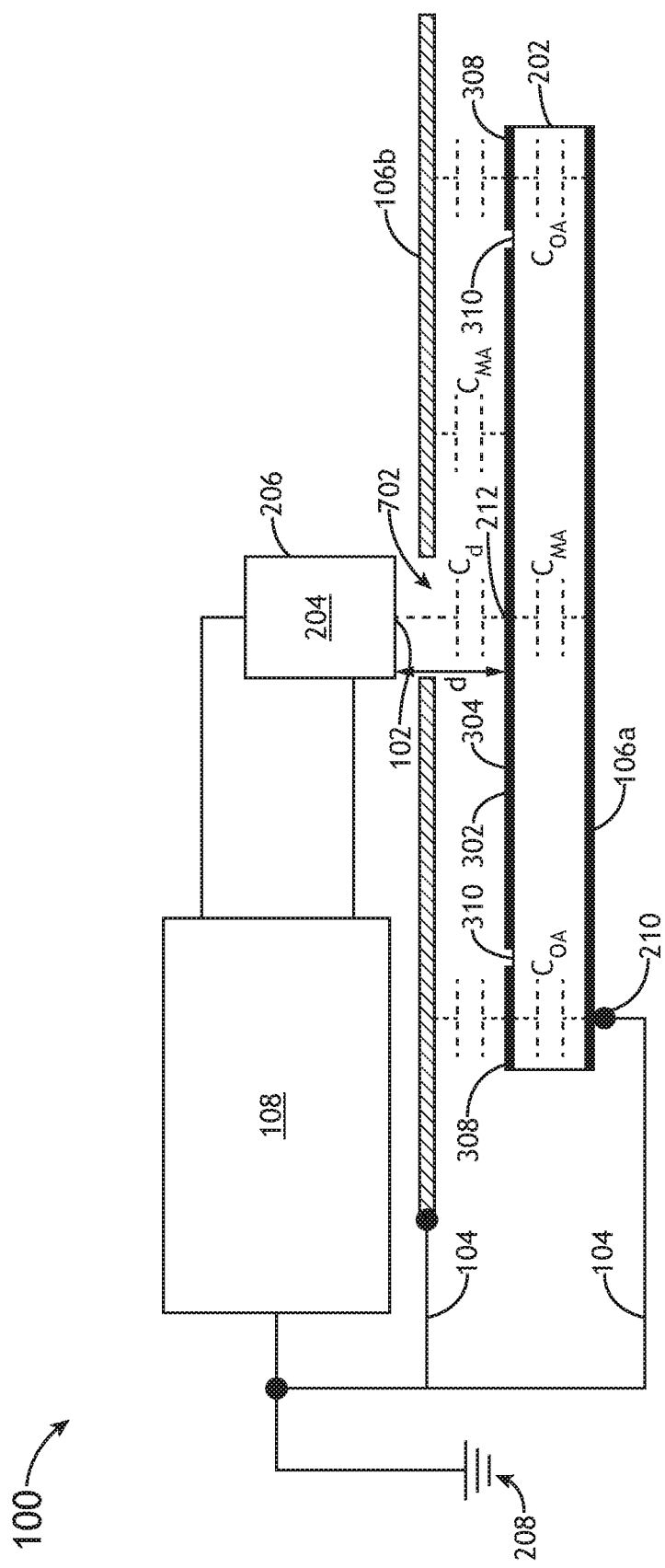
FIG. 8 is a conceptual view of a capacitive proximity measurement system for forming a measurement circuit with two conductive plates and an electrically-floating sample, in accordance with one or more embodiments of the present disclosure.

In some embodiments, capacitive proximity detection may incorporate multiple conductive plates 106. For example, FIG. 8 is a conceptual view of a capacitive proximity measurement system 100 for forming a measurement circuit with two conductive plates 106 and an electrically-floating sample 202, in accordance with one or more embodiments of the present disclosure. Further, the test surface 302 shown in FIG. 8 corresponds to the test surface 302 shown in FIG. 3. In FIG. 8, a first conductive plate 106a is formed as a conductive layer on a back surface of the sample 202 (e.g., as described previously herein with respect to FIG. 5), and a second conductive plate 106b is located on the same side of the test surface 302 as the sensor electrode 102 (e.g., as described previously herein with respect to FIG. 7).

In some embodiments, the capacitive proximity measurement system 100 is integrated into an external system. For example, the capacitive proximity measurement system 100 may be integrated into semiconductor processing tools such as, but not limited to, a metrology system, an inspection system, a lithography system, or the like. In this regard, the capacitive proximity measurement system 100 may facilitate the determination of a position of a sample 202 (e.g., sample height with respect to components of the tool such as lenses, detectors, or the like) within the tool prior to or during operation. Further, the proximity measurements may be utilized to dynamically control or otherwise adjust the position of the sample 202 in the tool. By way of another example, the proximity measurements may be provided as feedback and/or feedforward data to additional process tools.

Figure 9:
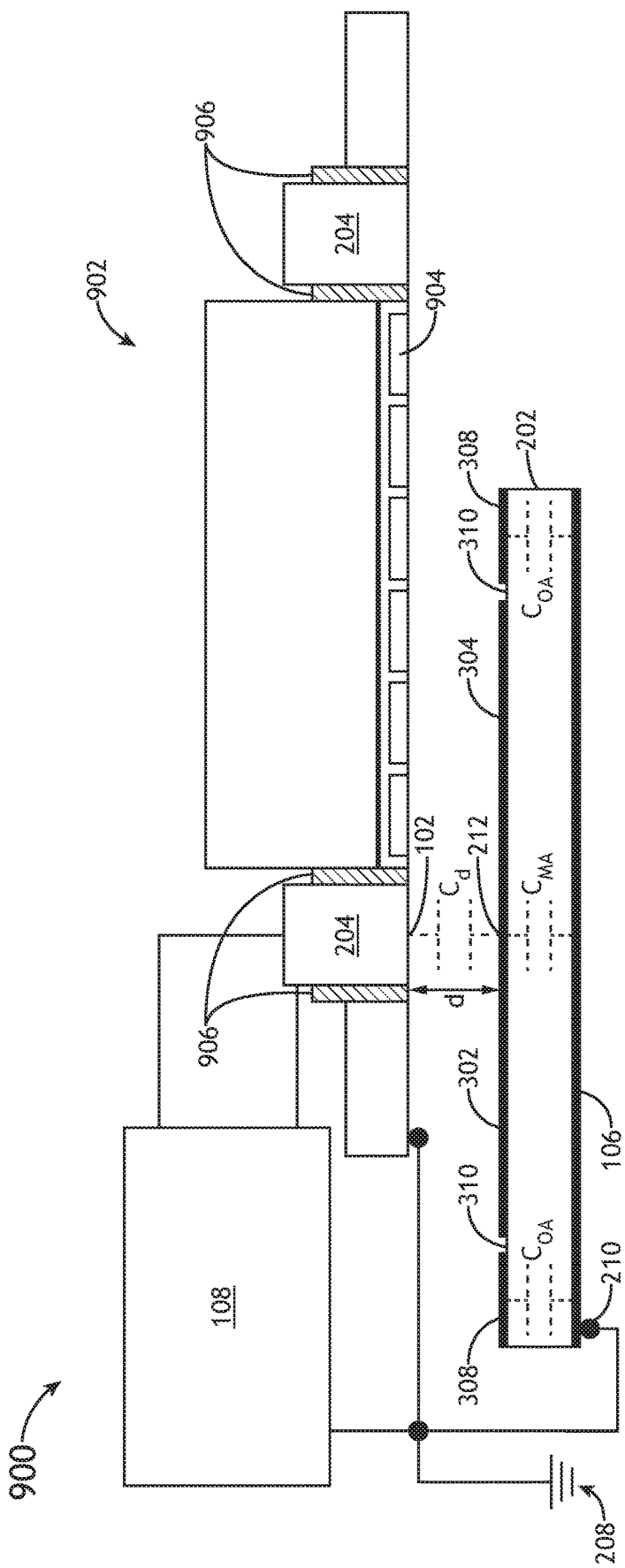
FIG. 9 is a conceptual view of an inspection tool including a capacitive proximity measurement system, in accordance with one or more embodiments of the present disclosure.

FIG. 9 is a conceptual view of an inspection tool 900 including the capacitive proximity measurement system 100, in accordance with one or more embodiments of the present disclosure. In one embodiment, one or more sensor electrodes 102 are positioned proximate to an electron source column 902 of the inspection tool 900. For example, the source column 902 may include one or more electrodes 904 suitable for illuminating the sample 202 (e.g., the measurement area 304) for inspection. Further, the one or more sensor electrodes 102 may be, but are not required to be electrically isolated from the source column 902 by insulation 906.

In another embodiment, the capacitive proximity measurement system 100 may be integrated into an external system such that a portion of the system may form a conductive plate 106 as described herein. For example, as illustrated in FIG. 8, the conductive plate 106 may be formed from the bottom of the source column 902.

Figure 10:
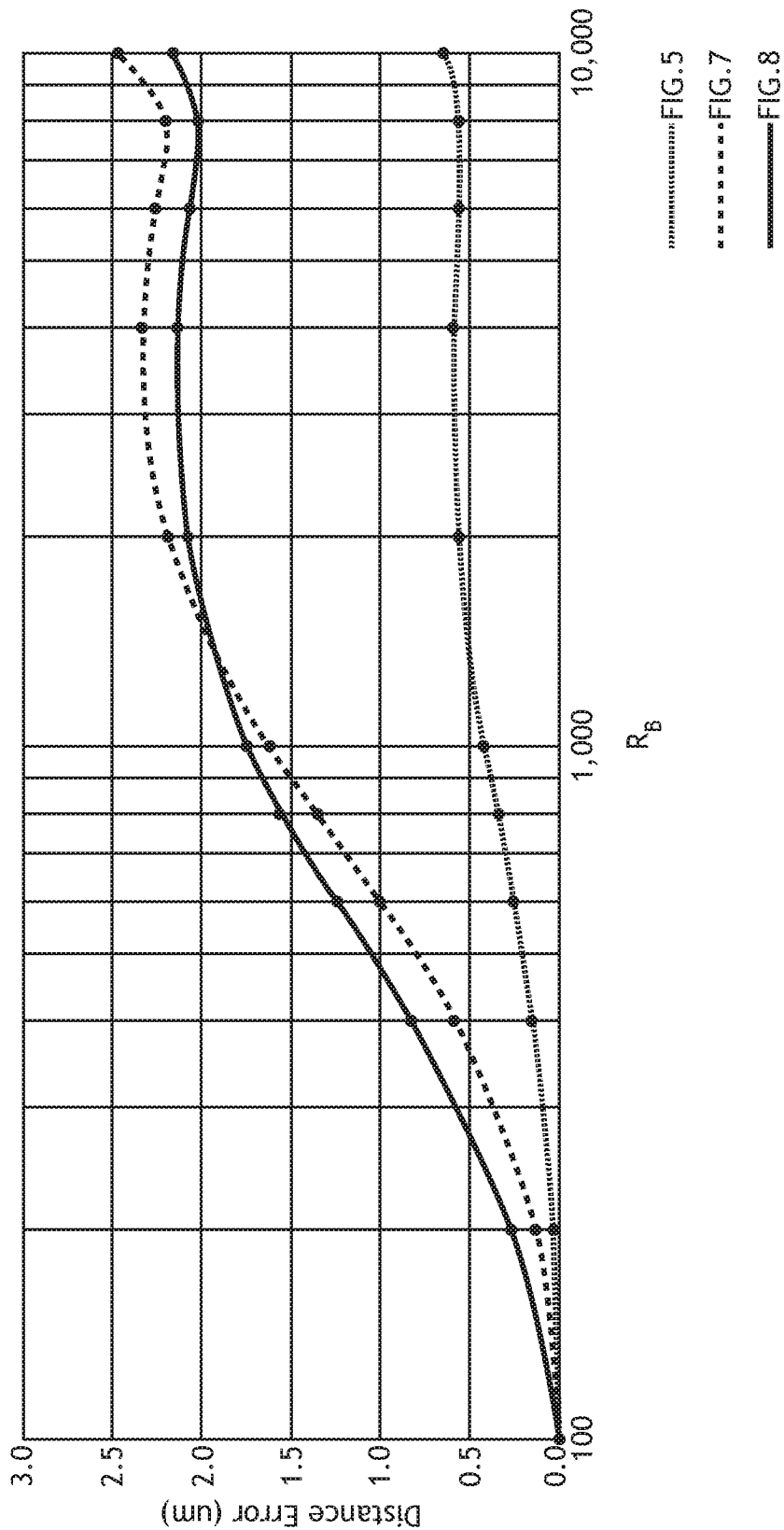
FIG. 10 is a plot illustrating simulations of the performance of different configurations of a capacitive proximity measurement system illustrated in FIGS. 5, 7, and 8 as a function of the resistance of the insulating border, in accordance with one or more embodiments of the present disclosure.

FIG. 10 is a plot illustrating simulations of the performance of different configurations of the capacitive proximity measurement system 100 illustrated in FIGS. 5, 7, and 8 as a function of the resistance of the insulating border 306, in accordance with one or more embodiments of the present disclosure. In particular FIG. 10 provides a distance error as a function of the resistance ($R_B$) of the insulating border 306 (e.g., including any conductive bridges 310), where the distance error represents a difference between actual and measured distances between the lead connection point 210 and the detection area 212 (e.g., see FIG. 3). As illustrated in FIG. 10, each of the different configurations of the capacitive proximity measurement system 100 illustrated in FIGS. 5, 7, and 8 substantially limit the impact of the variable surface resistance in all cases. Further, the configuration of FIG. 5 in which a conductive plate 106 is located on an opposite side of the test surface 302 as the sensor electrode 102 exhibited relatively low errors (e.g., distance error) for resistance values ranging from 0 to 10,000 Ohms.

Figure 11:
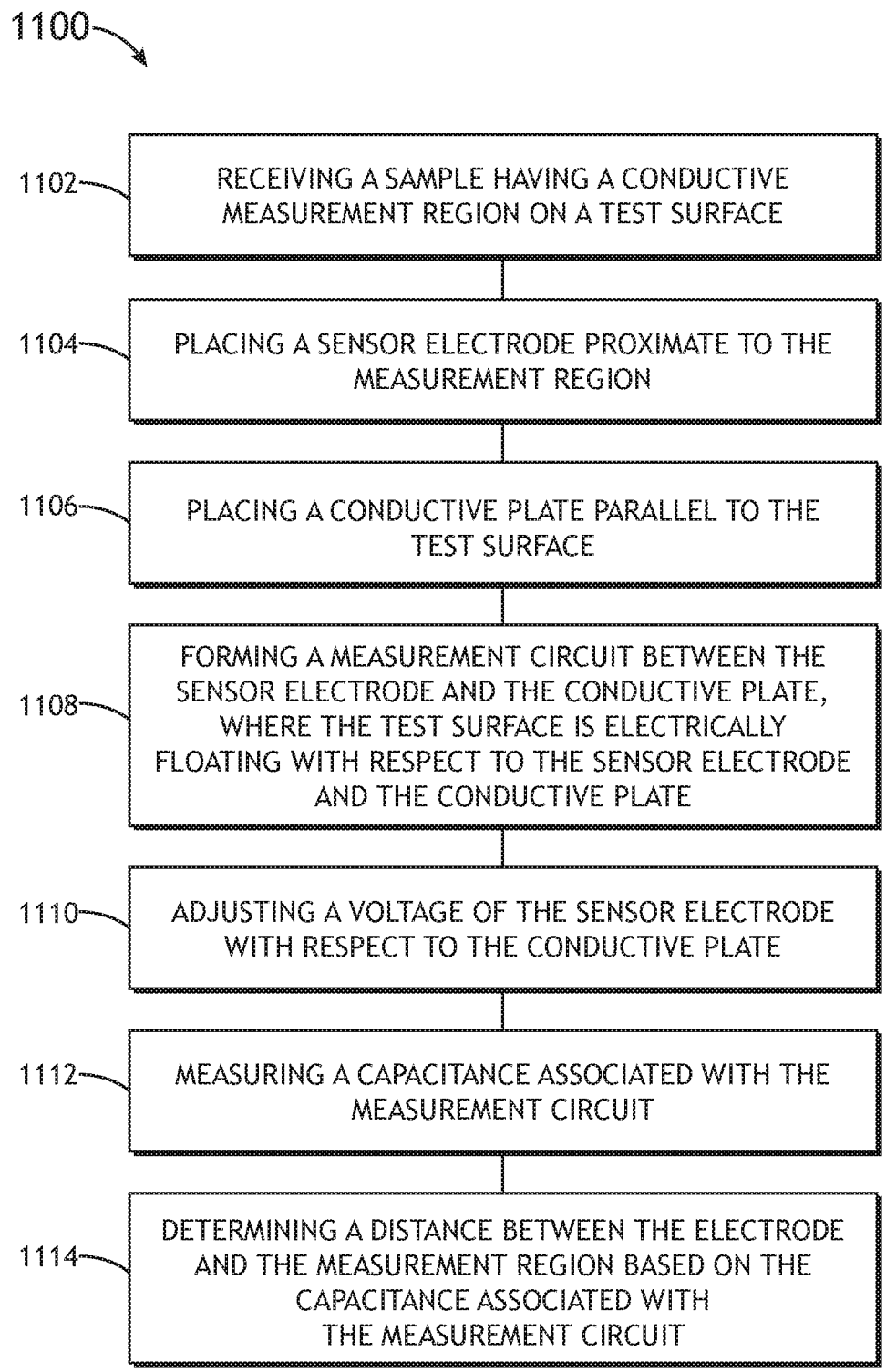
FIG. 11 is a flow diagram illustrating steps performed in a method for performing capacitive proximity measurements, in accordance with one or more embodiments of the present disclosure.

FIG. 11 is a flow diagram illustrating steps performed in a method 1100 for performing capacitive proximity measurements, in accordance with one or more embodiments of the present disclosure. Applicant notes that the embodiments and enabling technologies described previously herein in the context of the capacitive proximity measurement system 100 should be interpreted to extend to method 1100. It is further noted, however, that the method 1100 is not limited to the architecture of the capacitive proximity measurement system 100.

In one embodiment, the method 1100 includes a step 1102 of receiving a sample having a conductive measurement region on a test surface. Further, a surface resistance of the test surface may, but is not required to, have a spatially-varying resistance. For example, the sample may include an insulating border to at least partially isolate the measurement area from an outer portion of the sample that may also be conductive. In another embodiment, the method 1100 includes a step 1104 of placing a sensor electrode proximate to the measurement region. In another embodiment, the method 1100 includes a step 1106 of placing a conductive plate parallel to the test surface. For example, the conductive plate may be located on the same side or the opposite of a test surface of the sample as the sensor electrode. Further, the conductive plate may be, but is not required to be, larger than a measurement area of the sample. In another embodiment, the method 1100 includes a step 1108 of forming a measurement circuit between the sensor electrode and the conductive plate, where the sample (e.g., the test surface) is electrically floating with respect to the sensor electrode and the conductive plate. In this regard, the measurement circuit may include at least a capacitance between the sensor electrode and the measurement area and a capacitance between the measurement area and the conductive plate. In another embodiment, the method 1100 includes a step 1110 of adjusting a voltage of the sensor electrode with respect to the conductive plate. For example, the step 1110 may include providing any combination of static or alternating voltages to the sensor electrode 102. In another embodiment, the method 1100 includes a step 1112 of measuring a capacitance associated with the measurement circuit (e.g., based on the applied voltage). In another embodiment, the method 1100 includes a step 1114 of determining a distance between the electrode and the measurement region based on the capacitance associated with the measurement circuit.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. A capacitive proximity measurement system comprising:
   a sensor electrode configured to be positioned proximate to a conductive measurement area on a test surface of a sample;
   a plate connector configured to provide an electrical connection between a system ground and a conductive plate parallel to the test surface, wherein a measurement circuit is formed between the sensor electrode and the conductive plate, wherein the test surface is electrically floating with respect to the sensor electrode and the conductive plate; and
   a controller communicatively coupled to the sensor electrode and the plate connector, the controller including one or more processors configured to execute program instructions causing the one or more processors to:
      adjust a voltage of the sensor electrode with respect to the conductive plate;
      determine a capacitance associated with the measurement circuit; and
      determine a distance between the electrode and the measurement area based on the capacitance associated with the measurement circuit.

2. The system of claim 1, wherein the conductive plate has an area larger than the measurement area.

3. The system of claim 1, wherein the conductive plate comprises:
   a conductive coating on a back face of the sample opposite the surface.

4. The system of claim 1, wherein the conductive plate and the sensor electrode are on a common side of the test surface.

5. The system of claim 4, wherein the conductive plate includes an aperture, wherein the sensor electrode is aligned with the aperture.

6. The system of claim 5, wherein at least a portion of the electrode protrudes through the aperture.

7. The system of claim 1, wherein the conductive plate comprises:
   a bottom surface of an electron beam column.

8. The system of claim 1, wherein the measurement circuit includes at least a capacitance between the sensor electrode and the measurement area and a capacitance between the measurement area and the conductive plate.

9. The system of claim 8, further comprising:
   measuring the capacitance between the measurement area and the conductive plate;
   determining the capacitance between the sensor electrode and the measurement area based on the measured capacitance between the measurement area and the conductive plate; and
   determining the distance between the electrode and the measurement area based on the capacitance between the sensor electrode and the measurement area.

10. The system of claim 1, wherein the test surface of the sample includes the conductive measurement area separated from an additional conductive region by a border having a spatially-varying resistance.

11. The system of claim 10, wherein the border comprises:
    an insulating border having one or more conductive bridges connecting the conductive measurement area with the additional conductive region.

12. The system of claim 1, wherein the sample comprises:
    a reflective reticle.

13. The system of claim 1, wherein the sample comprises:
    a reticle suitable for lithography using extreme ultraviolet light.

14. An inspection system comprising:
    an electron beam column for directing an electron beam to a sample; and
    a capacitive proximity measurement system located adjacent to the electron beam column, the capacitive proximity measurement system comprising:
       a sensor electrode configured to be positioned proximate to a conductive measurement area on a test surface of a sample;
       a plate connector configured to provide an electrical connection between a system ground and a conductive plate parallel to the test surface, wherein a measurement circuit is formed between the sensor electrode and the conductive plate, wherein the test surface is electrically floating with respect to the sensor electrode and the conductive plate; and
       a controller communicatively coupled to the sensor electrode and the plate connector, the controller including one or more processors configured to execute program instructions causing the one or more processors to:
          adjust a voltage of the sensor electrode with respect to the conductive plate;
          determine a capacitance associated with the measurement circuit; and
          determine a distance between the electrode and the measurement area based on the capacitance associated with the measurement circuit.

15. The system of claim 14, wherein the conductive plate comprises:
    a bottom surface of the electron beam column.

16. The system of claim 14, wherein the conductive plate comprises:
    a conductive coating on a back face of the sample opposite the surface.

17. The system of claim 14, wherein the conductive plate and the sensor electrode are on a common side of the test surface.

18. The system of claim 17, wherein the conductive plate includes an aperture, wherein the sensor electrode is aligned with the aperture.

19. The system of claim 18, wherein at least a portion of the electrode protrudes through the aperture.

20. A method for capacitive proximity measurements comprising:
    receiving a sample having a conductive measurement area on a test surface;

placing a sensor electrode proximate to the measurement area;

placing a conductive plate parallel to the test surface;

forming a measurement circuit between the sensor electrode and the conductive plate, wherein the test surface is electrically floating with respect to the sensor electrode and the conductive plate;

adjusting a voltage of the sensor electrode with respect to the conductive plate;

measuring a capacitance associated with the measurement circuit; and determining a distance between the electrode and the measurement area based on the capacitance associated with the measurement circuit.

21. The method of claim 20, wherein the conductive plate has an area larger than the measurement area.

22. The method of claim 20, wherein the conductive plate comprises:

a conductive coating on a back face of the sample opposite the surface.

23. The method of claim 20, wherein the conductive plate and the sensor electrode are on a common side of the test surface.

24. The method of claim 23, wherein the conductive plate includes an aperture, wherein the sensor electrode is aligned with the aperture.

25. The method of claim 24, wherein at least a portion of the electrode protrudes through the aperture.

26. The method of claim 20, wherein the conductive plate comprises:

a bottom surface of an electron beam column.

27. The method of claim 20, wherein the measurement circuit includes at least a capacitance between the sensor electrode and the measurement area and a capacitance between the measurement area and the conductive plate.

28. The method of claim 27, further comprising:

measuring the capacitance between the measurement area and the conductive plate; and determining the capacitance between the sensor electrode and the measurement area based on the measured capacitance between the measurement area and the conductive plate; and determining the distance between the electrode and the measurement area based on the capacitance between the sensor electrode and the measurement area.

29. The method of claim 20, wherein a test surface of the sample includes a conductive measurement area separated from an additional conductive region by a border having a spatially-varying resistance.

30. The method of claim 29, wherein the border comprises:

an insulating border having one or more conductive bridges connecting the measurement area with the additional conductive region.

31. The method of claim 20, wherein the sample comprises:

a reflective reticle.

32. The method of claim 20, wherein the sample comprises:

a reticle suitable for lithography using extreme ultraviolet light.

* * * * *